(12) United States Patent
Shiraishi

(10) Patent No.: US 6,640,091 B1
(45) Date of Patent: Oct. 28, 2003

(54) DUAL-BAND OUTPUT SWITCHING HIGH-FREQUENCY TRANSMISSION CIRCUIT WITH A TRANSMISSION MIXER HAVING TWO OUTPUTS

(75) Inventor: Osamu Shiraishi, Tokyo (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 361 days.

(21) Appl. No.: 09/628,554

(22) Filed: Jul. 28, 2000

(30) Foreign Application Priority Data

Jul. 30, 1999 (JP) .......................................... 11-217462

(51) Int. Cl.[7] .............................................. H01Q 11/12
(52) U.S. Cl. ...................... 455/118; 455/552; 455/553; 455/91; 455/63.3; 331/18
(58) Field of Search ........................... 455/91, 118, 313, 455/323, 318, 552–553, 63.3; 331/18

(56) References Cited

U.S. PATENT DOCUMENTS

| | | | |
|---|---|---|---|
| 4,916,411 A | | 4/1990 | Lymer |
| 5,983,082 A | * | 11/1999 | Hilbert ........................ 455/76 |
| 6,195,563 B1 | * | 2/2001 | Samuels ..................... 455/553 |
| 6,282,252 B1 | * | 8/2001 | Fushimi ...................... 375/346 |
| 6,343,221 B1 | * | 1/2002 | Toda ........................... 455/553 |

FOREIGN PATENT DOCUMENTS

| | | | |
|---|---|---|---|
| EP | 0 653 851 A2 | | 11/1994 |
| JP | 54-061511 | * | 5/1979 |
| JP | 04-078202 | | 3/1992 |
| JP | 04-269013 | * | 9/1992 |
| JP | 5-244032 | | 9/1993 |
| JP | 06-053753 | * | 2/1994 |
| JP | 06-090204 | * | 3/1994 |
| JP | 06-343041 | | 12/1994 |
| JP | 08-223065 | | 8/1996 |
| JP | 8-223073 | | 8/1996 |
| JP | 10-107676 | | 4/1998 |
| JP | 10-303761 | * | 11/1998 |

* cited by examiner

Primary Examiner—William Trost
Assistant Examiner—Brandon J Miller
(74) Attorney, Agent, or Firm—McGinn & Gibb, PLLC

(57) ABSTRACT

A transmission mixer (10) has a local input port ($10_{LO}$) supplied with a local signal, an intermediate input port ($10_{in}$) supplied with an input signal having an input frequency ($f_{in}$) a first output port ($10_{out1}$) for producing a first output signal having a first output frequency ($f_{out1}$), and a second output port ($10_{out2}$) for producing a second output signal having a second output frequency ($f_{out2}$). The first and the second output ports ($10_{out1}$, $10_{out2}$) are connected to first and second loads (LD1, LD2), respectively. The first load (LD1) is that where impedance-matching is made at the first output frequency ($f_{out1}$) while the second load (LD2) is that where impedance-matching is made at the second output frequency ($f_{out2}$).

20 Claims, 3 Drawing Sheets

DUAL-BAND OUTPUT SWITCHING HIGH-FREQUENCY TRANSMISSION CIRCUIT WITH A TRANSMISSION MIXER HAVING TWO OUTPUTS

BACKGROUND OF THE INVENTION

This invention relates to a dual-band output switching high-frequency transmission circuit and, more particularly, to a transmission mixer for use in a dual-band portable equipment to convert an intermediate frequency into a transmission frequency.

In prior art, in a portable telephone has been developed a dual-band portable equipment which uses two radio frequency bands such as 900 MHz and 1.8 GHz in the manner which are represented in GSM900/DCS-1800. As a transmission mixer for use in the dual-band portable equipment, a conventional miser is assigned with a band because the conventional mixer has only one output in the manner which will later be described in conjunction with FIG. 1.

In addition, various preceding arts related to the present invention are already known. By way of example, U.S. Pat. No. 4,916,411 or U.S. Pat. No. 4,916,411 discloses a variable frequency jitter generator which has a wide range of a bit rate without an unnecessary repetition of circuit elements. In U.S. Pat. No. 4,916,411, a circuit for generating jitter includes a mixer which mixes a jittered signal from a jitter generator with the output of a variable frequency oscillator to produce a broadband jittered output. A preferred form of the circuit uses a double frequency translation technique in which the output from a frequency oscillator is applied to a jitter generator and to a first frequency translation device to translate a variable input frequency to an intermediate frequency. The jittered signal and the intermediate frequency signal are then applied to a second frequency translation device to produce a jittered output at the variable input frequency.

In addition, Japanese Unexamined Patent Publication of Tokkai No. Hei 5-244,032 or JP-A 5-244032 describes "DUAL-BAND RADIO COMMUNICATION APPARATUS" to increase circuits which can be shared and reduce the size of the apparatus by converting an IF signal into a radio signal of a first or second band with common local oscillation signal consisting of an intermediate frequency of a transmission radio frequency. In JP-A 5-244032, for communication in the first or second band, a fundamental wave consisting of the intermediate frequency of a frequency synthesizer is outputted as a common local oscillation signal to a fixer. A first transmitting band pass filter circuit extracts the signal of the first band from the converted signal and sends it. A second transmitting band pass filter circuit extracts the signal of the second band from the converted signal and sends it. Then the received signals are inputted by an antenna selector to first and second receiving band pass filter circuits. The received signal is converted down by being multiplied by the local oscillation signal of a frequency synthesizer so that it is converted to a first reception IF frequency by a mixer. Thus, the circuits which can be shared are increased to reduce the size of the apparatus.

Furthermore, European Patent Publication No. 653851 or EP A 653851 discloses a radio communication apparatus of multi-band which is suitable to radio frequency bands which are relatively apart from each other. That is, the radio communication apparatus according to SP A 653851 comprises a common oscillator having an oscillation frequency which is selected so as to become about middle between a first frequency band and a second frequency band.

In addition, Japanese Unexamined Patent Publication of Tokkai No. Hei 8-223,073 or JP-A 8-233073 discloses a heterodyne "DUAL BAND RADIO COMMUNICATION EQUIPMENT" which is used in common in two bands like 800 MHz band and 1.5 GHz band in a digital land mobile radiotelephone. That is, in JP-A 8-223073, a reception intermediate frequency is made equal to a transmission/reception frequency difference between first and second radio frequency bands, and a frequency of a transmission intermediate frequency signal is set to two-fold frequency of the transmission/reception frequency difference. In addition, the dual band radio communication equipment comprises a first local oscillating circuit for oscillating a first local oscillation signal for converting a received signal of the first radio frequency band into a received intermediate frequency signal, a second local oscillating circuit for oscillating a second local oscillation signal for converting a received signal of the second radio frequency band into a received intermediate frequency signal, a first switch for performing switching between the first and the second local oscillation signals to produce a selected local oscillation signal which is supplied to a reception mixer, and a second switch for performing switching between the first or the second local oscillation signal and a third local oscillation signal The second switch produces an output signal which is supplied to a transmission mixer for multiplying the output signal by the transmission intermediate frequency signal to produce a transmission signal having a prescribed frequency band of the first radio frequency band and a transmission signal having a prescribed frequency band of the second radio frequency band.

Furthermore, Japanese Unexamined Patent Publication of Tokkai No. Hei 10-107,676 or JP-A 10-107676 discloses "COMMUNICATING APPARATUS" which corresponds to a dual band in which the frequency intervals between a transmitting band and a receiving band are different from each other and also makes this apparatus small, light, inexpensive and which also is low power consumption by setting the frequency of a voltage-controlled offset signal oscillator (offset VCO) so that it may be equal to the difference of intervals between transmitting band and receiving band. The communication apparatus disclosed in JP-A 10-107676 appropriately combines an offset VCO, a first high frequency VCO and a second high frequency VCO and generates a high frequency that is needed for transmission and receiving. The difference of the two transmitting band and receiving band is set to be equal. Thereby, a high frequency signal that is needed for the transmission and receiving of the dual band can be created with minimum block structure. In addition, the frequency of an IF signal becomes equal in either case of two receiving bands, the structure of a receiving system after a receiving mixer can be simplified, and it is possible to make this apparatus light and be low power consumption.

Any of the above-mentioned Publications merely discloses an one-output mixer.

In the manner which will later be described in conjunction with FIGS. 2 and 3, a conventional dual-band output switching high-frequency transmission circuit is disadvantageous in that two transmission mixers becomes a necessity or an external switch for switching output frequency matching circuits or the like becomes a necessity extra.

SUMMARY OF THE INVENTION

It is therefore an object of this invention to provide a dual-band output switching high-frequency transmission circuit in which a switch for switching matching circuits is not necessitated.

It is another object of this invention to provide a transmission mixer for use in the above-mentioned dual-band output switching high-frequency transmission circuit.

It is still another object of this invention to provide a dual-band output switching high-frequency transmission circuit of the type described, which is capable of miniaturizing a circuit.

It is yet another object of this invention to provide a transmission mixer for use in the above-mentioned dual-band output switching high-frequency transmission circuit.

It is a further object of this invention to provide a dual-band output switching high-frequency transmission circuit of the type described, which is capable of reducing a consumed current.

It is a still further object of this invention to provide a transmission mixer for use in the above-mentioned dual-band output switching high-frequency transmission circuit.

Other objects of this invention will become clear as the description proceeds.

In order to achieve the above-mentioned objects, this invention adopts technical structure as follows. That is, this invention provides a circuit combining a following five items in order to simplify structure:

① A mixer having two output ports;
② A mixer having two output frequencies which are apart from each other;
③ A mixer having an output stage which may be connected to a two-band band pass filter;
④ A switching of two-band outputs can be carried out by switching a local frequency of a mixer; and
⑤ It is possible to decrease the number of a transmission mixer in a dual-band portable equipment to one.

On describing the gist of an aspect of this invention, it is possible to be understood that a transmission mixer is for use in a dual-band portable equipment to convert an intermediate frequency into a transmission frequency. According to this invention, the above-understood transmission mixer has a local input port supplied with a local signal having a local frequency from a local oscillator, an intermediate input port supplied with an input signal having an input frequency which is equal to the intermediate frequency, a first output port for producing a first output signal having a first output frequency, and a second output port for producing a second output signal having a second output frequency which is different from the first output frequency.

In the above-mentioned transmission mixer, it may be preferable that the first and the second output ports are connected to first and second loads, respectively, the first load is that where impedance-matching is made at the first output frequency, and the second load is that where impedance-matching is made at the second output frequency. In addition, the above-mentioned transmission mixer desirably may have a power-supply terminal applied with a power-supply voltage and a ground terminal having a ground potential and the transmission mixer may comprise a first npn-type bipolar transistor having a base electrode connected to the local input terminal, a collector electrode connected to the power-supply terminal through the first load, and an emitter electrode connected to a common node, a second npn-type bipolar transistor having a collector electrode connected to the power-supply terminal through the load and an emitter electrode connected to the common node, a third npn-type bipolar transistor having a collector electrode connected to the common node and an emitter electrode connected to the ground terminal, a first output capacitor connected between the collector terminal of the first npn-type bipolar transistor and the first output port, a second output capacitor connected between the collector terminal of the second npn-type bipolar transistor and the second output port, a capacitor connected between a base electrode of the second npn-type bipolar transistor and the ground terminal, and an input capacitor connected between a base electrode of the third npn-type bipolar transistor and the intermediate input terminal. In addition, the base terminals of said first through said third npn-type bipolar transistors are supplied with a bias voltage from a bias circuit.

On describing the gist of another aspect of this invention, it is possible to be understood that a dual-band output switching high-frequency transmission circuit is for use in a dual-band portable equipment. According to this invention, the above-understood dual-band output switching high-frequency transmission circuit comprises a first local oscillator for oscillating a first local signal having a first local frequency, a second local oscillator for oscillating a second local signal having a second local frequency which is different from the first local frequency, a transmission mixer having a local input port selectively supplied with one of the first and the second local signals, an intermediate input port supplied with an input signal having an input frequency of an intermediate frequency, and first and second output ports for producing first and second output signals having first and second output frequencies which are different from each other, a first band pass filter connected to the first output port and having a pass band of the first output frequency, and a second band pass filter connected to the second output port and having a pass band of the second output frequency.

In the above-mentioned dual-band output switching high-frequency transmission circuit, the first and the second local frequencies may be lower than the first and the second output frequencies, respectively, the first output frequency may be equal to that obtained by adding the input frequency to the first local frequency, and the second output frequency may be equal to that obtained by adding the input frequency to the second local frequency. In addition, the first and the second local frequencies may be higher than the first and the second output frequencies, respectively, the first output frequency maybe equal to that obtained by subtracting the input frequency from the first local frequency, and the second output frequency may be equal to that obtained by subtracting the input frequency from the second local frequency. Further, the first local frequency may be higher than the first output frequency, the second local frequency may be lower than said second output frequency, the first output frequency may be equal to that obtained by subtracting the input frequency from the first local frequency, and the second output frequency may be equal to that obtained by adding the input frequency to the second local frequency. Furthermore, the first local frequency may be lower than the first output frequency, the second local frequency may be higher than the second output frequency, the first output frequency may be equal to that obtained by adding the input frequency to the first local frequency, and the second output frequency may be equal to that obtained by subtracting the input frequency from the second local frequency.

DESCRIPTION OF THE PREFERRED EMBODIMENT

Figure 1:
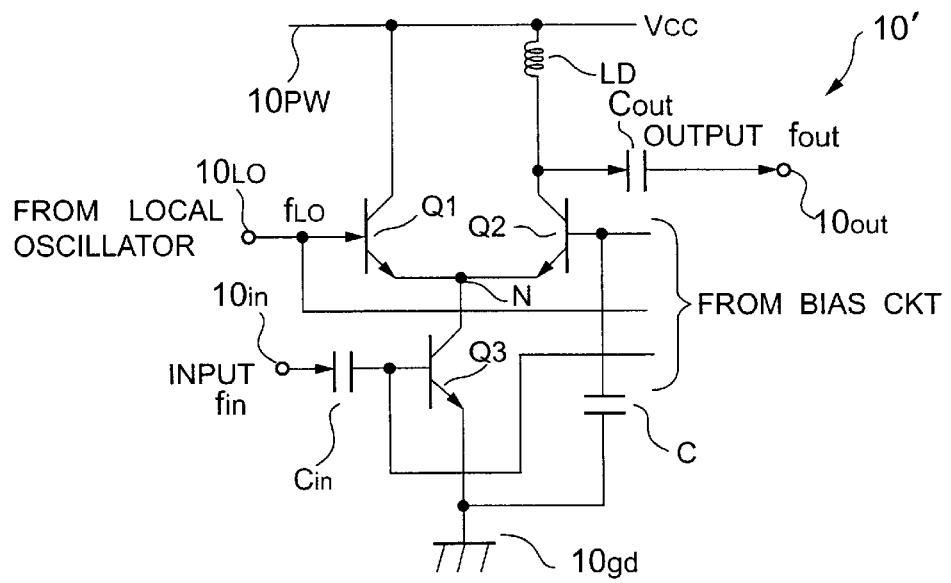
FIG. 1 is a circuit diagram of a conventional transmission mixer (one-output mixer)

Referring to FIG. 1, a conventional transmission mixer 10' will be described at first for better understanding of this invention. The illustrated transmission mixer 10' is a one-output mixer. The transmission mixer 10' has a local input port $10_{LO}$ supplied with a local signal having a local frequency $f_{LO}$ from a local oscillator (which is not shown in FIG. 1 and which will later become clear), an intermediate input port $10_{in}$ supplied with an input signal having an input frequency $f_{in}$ of an intermediate frequency, and an output port $10_{out}$ for producing an output signal having an output frequency $f_{out}$.

More specifically, the output port $10_{out}$ is connected to a load LD. The load LD is used that where impedance-matching is made at the output frequency $f_{out}$. The transmission mixer 10' has a power-supply terminal $10_{PW}$ applied with a power-supply voltage Vcc and a ground terminal $10_{gd}$ having a ground potential. The transmission mixer 10' comprises first through third npn-type bipolar transistor Q1, Q2, Q3, an output capacitor $C_{out}$, a capacitor C, and an input capacitor $C_{in}$.

The first npn-type bipolar transistor Q1 has a base electrode connected to the local input terminal $10_{LO}$, a collector electrode which is directly connected to the power-supply terminal $10_{PW}$, and an emitter electrode connected to a common node N. The second npn-type bipolar transistor Q2 has a collector electrode connected to the power-supply terminal 10PW through the load LD and an emitter electrode connected to the common node N. The third npn-type bipolar transistor Q3 has a collector electrode connected to the common node N and an emitter electrode connected to the ground terminal $10_{gd}$. The output capacitor $C_{out}$ is connected between the collector electrode of the second npn-type bipolar transistor Q2 and the output port $10_{out}$. The capacitor C is connected between a base electrode of the npn-type bipolar transistor Q2 and the ground terminal $10_{gd}$. The input capacitor $C_{in}$ is connected between a base electrode of the third npn-type bipolar transistor Q3 and the intermediate input port $10_{in}$.

In addition, the base electrodes of the first through the third npn-type bipolar transistor Q1 to Q3 are supplied to a bias voltage from a bias circuit (not shown).

Figure 2:
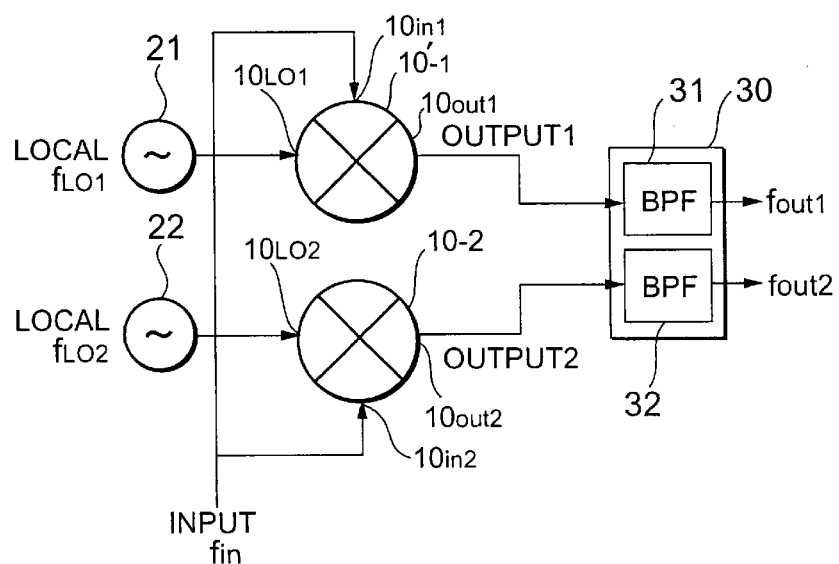
FIG. 2 is a block diagram of a conventional dual-band. output switching high-frequency transmission circuit using two transmission mixers illustrated in FIG. 1.

In a case where the above-mentioned mixer 10' is used to transmission of dual-band, two transmission mixers 10'-1 and 10'-2 become a necessity as illustrated in FIG. 2.

That is, FIG. 2 shows a first conventional dual-band output switching high-frequency transmission circuit. The illustrated dual-band output switching high-frequency transmission circuit comprises first and second local oscillators 21 and 22, first and second transmission mixers 10'-1 and 10'-2, and first and second band pass filters (BPFs) 31 and 32. The first local oscillator 21 oscillates a first local signal having a first local frequency fLO1. The second local oscillator 22 oscillates a second local signal having a second local frequency fLO2 which is different from the first local frequency fLO1. The first transmission mixer 10'-1 has a first local input port 10LO1 supplied with the first local signal, a first intermediate input port 10in1 supplied with an input signal having an input frequency fin which is equal to an intermediate frequency, and a first output port for producing a first output signal having a first output frequency fout1. The second transmission mixer 10'-2 has a second local input port 10LO2 supplied with the second local signal, a second intermediate input port 10in2 supplied with the input signal having the input frequency fin of the intermediate frequency, and a second output port 10out2 for producing a second output signal having a second output frequency fout2. Connected to the first output port 10out1, the first band pass filter 31 has a pass band for the first output frequency fout1. Connected to the second output port 10out2, the second band pass filter 32 has a pass band for the second output frequency fout2.

On the other hand, attempt is made to use only one the conventional one-output mixer 10' for two bands.

Figure 3:
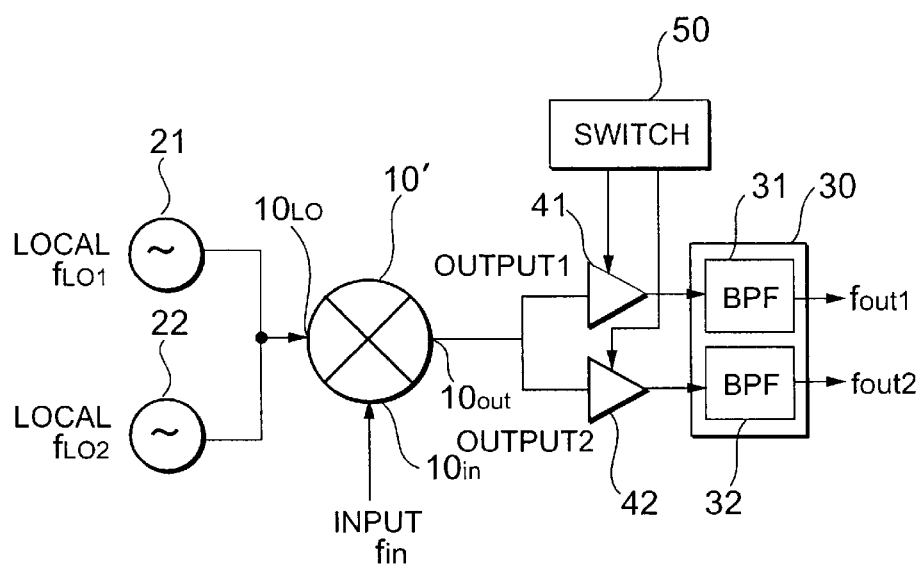
FIG. 3 is a block diagram of another conventional dual-band output switching high-frequency transmission circuit in which two buffers connected to the transmission mixers illustrated in FIG. 1 are switched by a switch.

FIG. 3 shows a second conventional dual-band output switching high-frequency transmission circuit, The illustrated dual-band output switching high-frequency transmission circuit comprises not only the first and the second local oscillators 21 and 22, the transmission mixer (the one-output mixer) 10', and the first and the second band pass filters (BPFs) 31 and 32 but also first and second buffers 41 and 42 and an external switch 50.

The first buffer 41 is disposed between the output port 10out of the transmission mixer 10' and the first band pass filter 31 while the second buffer 42 is disposed between the output port 10out of the transmission mixer 10' and the second band pass filter 32.

In addition, an output frequency matching circuit (impedance-matching LC circuit) may be used in lieu of the buffer.

That is, inasmuch as a filter 30 of an output stage has two bands, the second conventional dual-band output switching high-frequency transmission circuit is composed so that the output frequency matching circuits or the buffers 41 and 42 are switched by the external switch 50.

In the manner which is described above, in the dual-band portable equipment, the above-mentioned device must be made in a case of using the conventional one-output mixer 10' because the band pass filters of the output stage have the two inputs.

Figure 4:
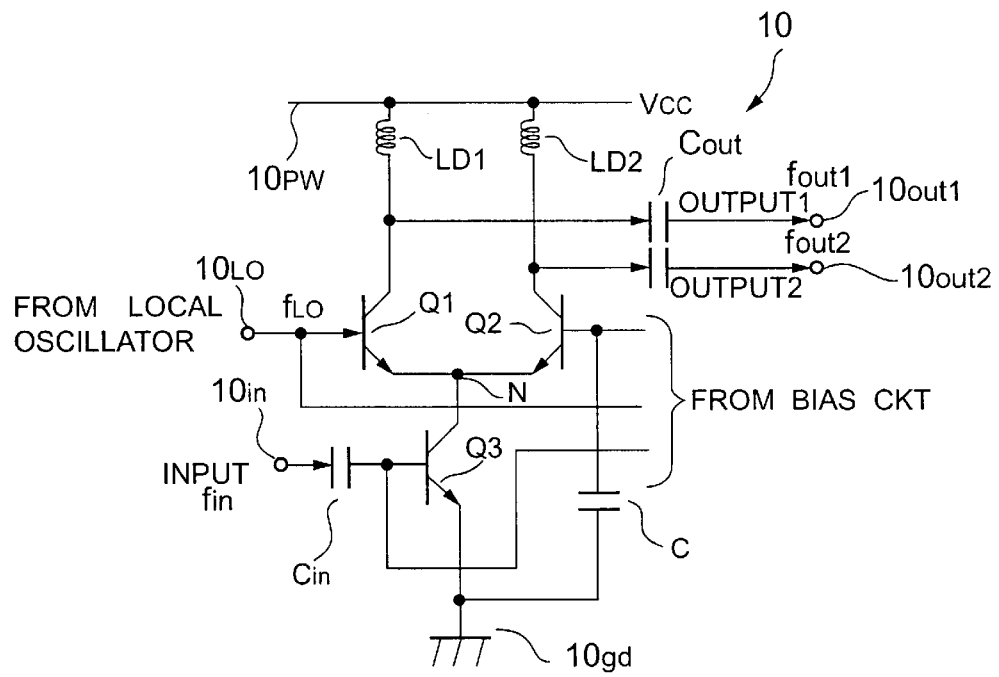
FIG. 4 is a circuit diagram of a transmission mixer (two-output mixer) according to an embodiment of this invention.

Referring to FIG. 4, the description will proceed to a transmission mixer 10 according to an embodiment of this invention. FIG. 4 is a circuit diagram showing a two-output mixer which is the transmission mixer 10 according to this invention. The illustrated transmission mixer (two-output mixer) is for use in a dual-band portable equipment to convert an intermediate frequency into a transmission frequency and has a structure having two output ports in which a collector output of each differential transistor in a balance-type mixer is connected to a load. The respective outputs are called a first output 1 and a second output 2. The output of each mixer is assigned with each frequency port. In the example being illustrated, the first output frequency 1 (fout1) is assigned with the first output 1 while the second output frequency 1 (fout2) is assigned with the second output 2.

More specifically, the transmission mixer 10 has a local input port $10_{LO}$ supplied with a local signal having a local frequency $f_{LO}$ from a local oscillator (not shown), an intermediate input port $10_{in}$ supplied with an input signal having an input frequency $f_{in}$ of the intermediate frequency, a first output port $10_{out1}$ for producing a first output signal having a first output frequency $f_{out1}$, and a second output port $10_{out2}$ for producing a second output signal having a second output frequency $f_{out2}$ which is different from the first output frequency $f_{out1}$. The first and the second output ports 10out1 and 10out2 are connected to first and second loads LD1 and LD2, respectively. The first load LD1 is that where impedance matching is made at the first output frequency $f_{out1}$ while the second load LD2 is that where impedance-matching is made at the second output frequency $f_{out2}$. In other words, optimization is made so that a value of an inductor serving as the load for each output and a value of a capacitor connected thereto in series are impedance matched at each frequency. That is, the first output 1 has an optimized impedance at the first output frequency fout1 while the second output 2 has an optimized impedance at the second output frequency fout2.

The transmission mixer 10 has a power-supply terminal $10_{PW}$ applied with a power-supply voltage Vcc and a ground terminal $10_{gd}$ having a ground potential. The transmission mixer 10 comprises first through third npn-type bipolar transistors Q1, Q2, Q3, first and second output capacitors $C_{out1}$ and $C_{out2}$, a capacitor C, and an input capacitor $C_{in}$.

The first npn-type bipolar transistor Q1 has a base electrode connected to the local input port $10_{LO}$, a collector electrode connected to the power-supply electrode $10_{PW}$ through the first load LD1, and an emitter electrode connected to a common node N. The second npn-type bipolar transistor Q2 has a collector electrode connected to the power-supply terminal $10_{PW}$ through the second load LD2 and an emitter electrode connected to the common node N. The third npn-type bipolar transistor Q3 has a collector electrode connected to the common $10_{gd}$ node N and an emitter electrode connected to the ground terminal The first output capacitor $C_{out1}$ is connected between the collector electrode of the first npn-type bipolar transistor Q1 and the first output port $10_{out1}$. The second output capacitor $C_{out2}$ is connected to the collector electrode of the second npn-type bipolar transistor Q2 and the second output port $10_{out2}$. The capacitor C is connected between a base electrode of the second npn-type bipolar transistor Q2 and the ground terminal $10_{gd}$. The input capacitor $C_{in}$ is connected between a base electrode of the third npn-type bipolar transistor Q3 and the intermediate input port $10_{in}$. In addition, the base electrodes of the first through the third npn-type bipolar transistors Q1 through Q3 are supplied with a bias voltage from a bias circuit (not shown).

Figure 5:
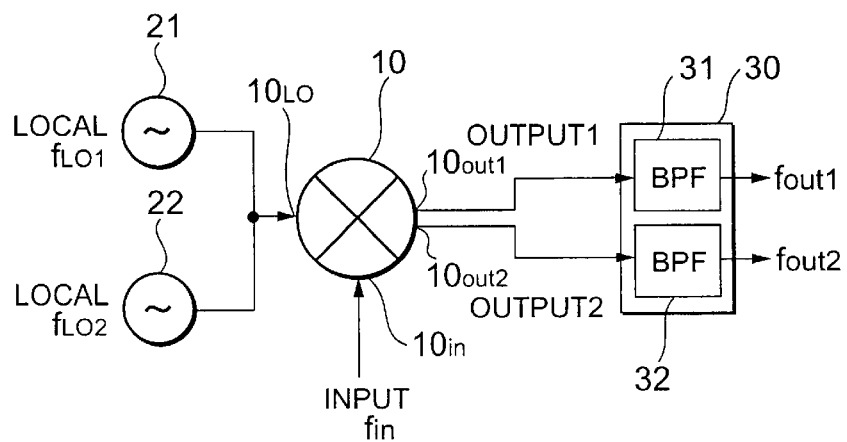
FIG. 5 is a block diagram of a dual-band output switching high-frequency transmission circuit using the transmission mixer illustrated in FIG. 4.

FIG. 5 shows a dual-band output switching high-frequency transmission circuit for use in a dual-band portable equipment that is capable of switching frequencies of two bands by using the transmission mixer (two-output mixer) 10 illustrated in FIG. 4.

The illustrated dual-band output switching high-frequency transmission circuit comprises the first and the second local oscillators 21 and 22, the transmission mixer 10, and the first and the second band pass filter (BPSs) 31 and 32. The first local oscillator 21 oscillates the first local signal having the first local frequency $f_{LO1}$. The second local oscillator 22 oscillates the second local signal having the second local frequency $f_{LO2}$ which is different from the first local frequency $f_{LO1}$. The transmission mixer 10 has the local input ports $10_{LO}$ supplied with the first or the second local signals, the intermediate input port $10_{in}$ supplied with the input signal having the input frequency fin of the intermediate frequency, first and second output ports $10_{out1}$ and $10_{out2}$ for producing the first and the second output signals having the first and the second output frequencies $f_{out1}$ and $f_{out2}$ which are different from each other. Connected to the first output port $10_{out1}$, the first band pass filter 31 has the pass band for the first output frequency $f_{out1}$. Connected to the second output port $10_{out2}$, the second band pass filter 32 has the pass band for the second output frequency $f_{out2}$.

In the example being illustrated, it will be assumed that the illustrated dual-band output switching high-frequency transmission circuit is a lower local system where the local frequency is lower than a radio transmission output frequency. That is, it will be assumed that the first and the second local frequencies $f_{out1}$ and $f_{out2}$ are lower than the first and the second output frequencies $f_{out1}$ and $f_{out2}$, respectively. In this event, the first output frequency $f_{out1}$ is equal to that obtained by adding the input frequency $f_{in}$ to the first local frequency $f_{LO}$ while the second output frequency $f_{out2}$ is equal to that obtained by adding the input frequency $f_{in}$ to the second local frequency $f_{out2}$. That is, following equations are satisfied:

$$f_{LO1}+f_{in}=f_{out1},$$

and $$f_{LO2}+f_{in}=f_{out2}.$$

The above-mentioned equations means that the two output frequencies $f_{out1}$ and $f_{out2}$ are switched by switching the local frequencies. Inasmuch as the two loads LD1 and LD2 for the outputs have the optimized impedance at the respective frequencies, the first output 1 has a large output level and the second output 2 has a small output level for the first output frequency $f_{out1}$ when the first output frequency $f_{out1}$ is selected as the output frequency. Conversely, when the second output frequency $f_{out2}$ is selected as the output frequency, the second output 2 has a large output level while the first output 1 has a small output level for the second output frequency $f_{out2}$.

In addition, as shown in FIG. 5, inasmuch as the first output 1 is connected to the first band pass filter 31 having the pass band of the first output frequency $f_{out1}$ and the second output 2 is connected to the second band pass filter 32 having the pass band of the second output frequency $f_{out2}$, finally, the first output signal having the output frequency $f_{out1}$ is outputted from the first output 1 and the second output signal having the output frequency fout2 is outputted from the second output 2. As a result, it is possible to carry out two-band outputs and its switching operation by using only one mixer. Accordingly, operation for switching the buffers 41 and 42 or the matching circuits or the likes by the external switch 50 as illustrated in FIG. 3 is unnecessary.

In addition, although structure is similar to that illustrated in FIG. 5, frequency structure may be modified to an upper local system in which the local frequencies are higher than the radio transmission output frequencies. That is, the first and the second local frequencies $f_{LO1}$ and $f_{LO2}$ may be higher than the first and the second output frequencies $f_{out1}$ and $f_{out2}$, respectively. In this event, the first output frequency $f_{out1}$ is equal to that obtained by subtracting the input frequency $f_{in}$ from the first local frequency $f_{LO1}$ while the second output frequency $f_{out2}$ is equal to that obtained by subtracting the input frequency $f_{in}$ from the second local frequency $f_{LO2}$. That is, this case has frequency relationships as follows:

$$f_{LO1} - f_{in} = f_{out1},$$

and $$f_{LO2} - f_{in} = f_{out2}.$$

Furthermore, a case of combining the lower local system with the upper local system may be considered. For example, the first local frequency $f_{LO1}$ may be higher than the first output frequency $f_{out1}$ and the second local frequency $f_{LO2}$ may be lower than the second output frequency $f_{out2}$. In this event, the first output frequency $f_{LO1}$ is equal to that obtained by subtracting the input frequency $f_{in}$ from the first local frequency $f_{out1}$ while the second output frequency $f_{out2}$ is equal to that obtained by adding the input frequency $f_{in}$ to the second local frequency $f_{LO2}$. That is, frequency relationships become as follows:

$$f_{LO1} - f_{in} = f_{out1},$$

and $$f_{LO2} + f_{in} = f_{out2}.$$

On behalf of this, the first local frequency $f_{LO1}$ may be lower than the first output frequency $f_{out1}$ while the second local frequency $f_{LO2}$ may be higher than the second output frequency $f_{out2}$. In this event, the first output frequency $f_{out1}$ is equal to that obtained by adding the input frequency fin to the first local frequency $f_{LO1}$ and the second output frequency $f_{out2}$ is equal to that obtained by subtracting the input frequency $f_{in}$ from the second local frequency $f_{LO2}$. That is, frequency relationships become as follows:

$$f_{LO1} + f_{in} = f_{out1},$$

and $$f_{LO2} - f_{in} = f_{out2}.$$

While this invention has thus far been described in conjunction with preferred embodiments thereof, it will now be readily possible for those skilled in the art to put this invention into various other manners.

What is claimed is:

1. A transmission mixer for use in a dual band portable equipment to convert an intermediate frequency into a transmission frequency, said transmission mixer comprising:
    a local input port supplied with a local signal having a local frequency from a local oscillator;
    an intermediate input port supplied with an input signal having an input frequency which is equal to the intermediate frequency;
    a first output port for producing a first output signal having a first output frequency; and
    a second output port separate from the first output port for producing a second output signal having a second output frequency which is different from the first output frequency.

2. A transmission mixer as claimed in claim 1, wherein said first and said second output ports are connected to first and second loads, respectively.

3. A transmission mixer as claimed in claim 2, further comprising:
    a power-supply terminal applied with a power-supply voltage;
    a ground terminal having a ground potential;
    a first npn-type bipolar transistor having a base electrode connected to said local input port, a collector electrode connected to said power-supply terminal through said first load, and an emitter electrode connected to a common node;
    a second npn-type bipolar transistor having a collector electrode connected to said power-supply terminal through said second load and an emitter electrode connected to the common node; and
    a third npn-type bipolar transistor having a collector electrode connected to the common node and an emitter electrode connected to said ground terminal.

4. A transmission mixer as claimed in claim 3, wherein the base terminals of said first through said third npn-type bipolar transistors are supplied with a bias voltage from a bias circuit.

5. A dual-band output switching high-frequency transmission circuit for use in a dual-band portable equipment, said dual-band output switching high-frequency transmission circuit comprising:
    a first local oscillator for oscillating a first local signal having a first local frequency;
    a second local oscillator for oscillating a second local signal having a second local frequency which is different from the first local frequency;
    a transmission mixer comprising:
        a local input port selectively supplied with one of said first and said second local signals,
        an intermediate input port supplied with an input signal having an input frequency of an intermediate frequency, and
        first and second output ports separate from each other for producing first and second output signals having first and second output frequencies which are different from each other;
    a first band pass filter connected to said first output port and having a pass band of said first output frequency; and
    a second band pass filter connected to said second output port and having a pass band of said second output frequency.

6. A dual-band output switching high-frequency transmission circuit as claimed in claim 5, wherein:
    said first and said second local frequencies are lower than said first and said second output frequencies, respectively;
    said first output frequency is equal to that obtained by adding said input frequency to said first local frequency; and
    said second output frequency is equal to that obtained by adding said input frequency to said second local frequency.

7. A dual-band output switching high-frequency transmission circuit as claimed in claim 5, wherein:
    said first and said second local frequencies are higher than said first and said second output frequencies, respectively;
    said first output frequency is equal to that obtained by subtracting said input frequency from said first local frequency; and
    said second output frequency is equal to that obtained by subtracting said input frequency from said second local frequency.

8. A dual-band output switching high-frequency transmission circuit as claimed in claim 5, wherein:
    said first local frequency is higher than said first output frequency;

said second local frequency is lower than said second output frequency;

said first output frequency is equal to that obtained by subtracting said input frequency from said first local frequency; and said second output frequency is equal to that obtained by adding said input frequency to said second local frequency.

9. A dual-band output switching high-frequency transmission circuit as claimed in claim 5, wherein:

said first local frequency is lower than said first output frequency;

said second local frequency is higher than said second output frequency;

said first output frequency is equal to that obtained by adding said input frequency to said first local frequency; and said second output frequency is equal to that obtained by subtracting said input frequency from said second local frequency.

10. A dual-band output switching high-frequency transmission circuit as claimed in claim 5, wherein said first and said second output ports are connected to first and second loads, respectively.

11. A dual-band output switching high-frequency transmission circuit as claimed in claim 10, said transmission mixer further comprising:

a power-supply terminal applied with a power-supply voltage;

a ground terminal having a ground potential;

a first npn-type bipolar transistor having a base electrode connected to said local input port, a collector electrode connected to said power-supply terminal through said first load, and an emitter electrode connected to a common node;

a second npn-type bipolar transistor having a collector electrode connected to said power-supply terminal through said load and an emitter electrode connected to the common node; and a third npn-type bipolar transistor having a collector electrode connected to the common node and an emitter electrode connected to said ground terminal.

12. A dual-band output switching high-frequency transmission circuit as claimed in claim 11, wherein the base terminals of said first through said third npn-type bipolar transistors are supplied with a bias voltage from a bias circuit.

13. The mixer of claim 2, wherein the first load has an impedance that matches the first output frequency and the second load has an impedance that matches the second output frequency.

14. The mixer of claim 3, further comprising:

a first output capacitor connected between the collector terminal of said first npn-type bipolar transistor and said first output port; and a second output capacitor connected between the collector terminal of said second npn-type bipolar transistor and said second output port.

15. The mixer of claim 3, further comprising a capacitor connected between a base electrode of the second npn-type bipolar transistor and the ground terminal.

16. The mixer of claim 3, further comprising an input capacitor connected between a base electrode of the third npn-type bipolar transistor and the intermediate input terminal.

17. The circuit of claim 5, wherein said first load has an impedance that matches the first output frequency and the second load has an impedance that matches the second output frequency.

18. The circuit of claim 11, further comprising:

a first output capacitor connected between the collector terminal of the first npn-type bipolar transistor and the first output port; and a second output capacitor connected between the collector terminal of the second npn-type bipolar transistor and the second output port.

19. The circuit of claim 11, further comprising a capacitor connected between a base electrode of the second npn-type bipolar transistor and the ground terminal.

20. The circuit of claim 11, further comprising an input capacitor connected between a base electrode of the third npn-type bipolar transistor and the intermediate input terminal.

* * * * *